(12) United States Patent
Feldmann et al.

(10) Patent No.: US 7,277,839 B2
(45) Date of Patent: Oct. 2, 2007

(54) METHOD FOR NUMERICALLY SIMULATING AN ELECTRICAL CIRCUIT

(75) Inventors: Jörg-Uwe Feldmann, München (DE); Reinhart Schultz, Unterhaching (DE)

(73) Assignee: Infineon Technologies AG, Munich (DE)

(*) Notice: Subject to any disclaimer, the term of this patent is extended or adjusted under 35 U.S.C. 154(b) by 623 days.

(21) Appl. No.: 10/422,580

(22) Filed: Apr. 24, 2003

(65) Prior Publication Data

US 2003/0204389 A1 Oct. 30, 2003

(30) Foreign Application Priority Data

Apr. 24, 2002 (DE) ................. 102 18 404

(51) Int. Cl.
G06F 17/50 (2006.01)
G06G 7/62 (2006.01)

(52) U.S. Cl. .......................... 703/13; 703/17
(58) Field of Classification Search ........... 703/13, 703/17

See application file for complete search history.

(56) References Cited

U.S. PATENT DOCUMENTS

| 4,918,643 | A | * | 4/1990 | Wong ..................... 703/4 |
| 4,985,860 | A | * | 1/1991 | Vlach ..................... 703/17 |
| 5,481,484 | A | * | 1/1996 | Ogawa et al. ............. 703/14 |
| 6,219,629 | B1 | | 4/2001 | Namiki |
| 6,266,630 | B1 | * | 7/2001 | Garcia-Sabiro et al. ...... 703/14 |

FOREIGN PATENT DOCUMENTS

WO 02/18747 A1 3/2002

OTHER PUBLICATIONS

Ian Sinclair, Collins Dictionary of Computing, 2000, Paperback 0-00-472512-3 (on-line edition), pp.: definitions of "download" and "network".*

Nagel, L. W.: "Spice2: A Computer Program to Simulate Semiconductor Circuits", Electronics Research Laboratory, University of California, Berkeley, ERL-M520, May 9, 1975, coversheet and pp. 174-187.

(Continued)

*Primary Examiner*—Paul Rodriguez
*Assistant Examiner*—Juan Carlos Ochoa
(74) *Attorney, Agent, or Firm*—Laurence A. Greenberg; Werner H. Stemer; Ralph E. Locher

(57) ABSTRACT

A method using a computer program for numerically simulating an electrical circuit, in a computer system, having a plurality of nodes and a plurality of circuit elements. A circuit description of the electrical circuit together with $t_{start}$ and $t_{stop}$ times of a time interval are read into the computer system with at least one input value of the electrical circuit for at least one specific time in the time interval. Voltage values and/or current values at the nodes of the electrical circuit are calculated in the selected time interval using table-based models for the circuit elements. From these voltage values and/or current values, a simulation time $t_n$ in the time interval $[t_{start}; t_{stop}]$ under consideration is selected at which system equations are determined describing the circuit elements by physical formulas and dynamic effects of the elements are described by differential equations. The system equations are solved to calculate the voltage and/or current values at the nodes at the selected simulation time and a profile of previously calculated voltage and/or current values in the time interval are output from the computer system.

35 Claims, 5 Drawing Sheets

OTHER PUBLICATIONS

Kielkowski, R. M.: "Inside Spice, Overcoming the Obstacles of Circuit Simulation", McGraw-Hill, Inc., New York, 1994, pp. coversheet and pp. 126-145.

Chua, L. O. et al.: "Computer-Aided Analysis of Electronic Circuits", Prentice-Hall, Inc., Engelwood Cliffs, New Jersey, 1975, coversheet and pp. 62-97.

* cited by examiner

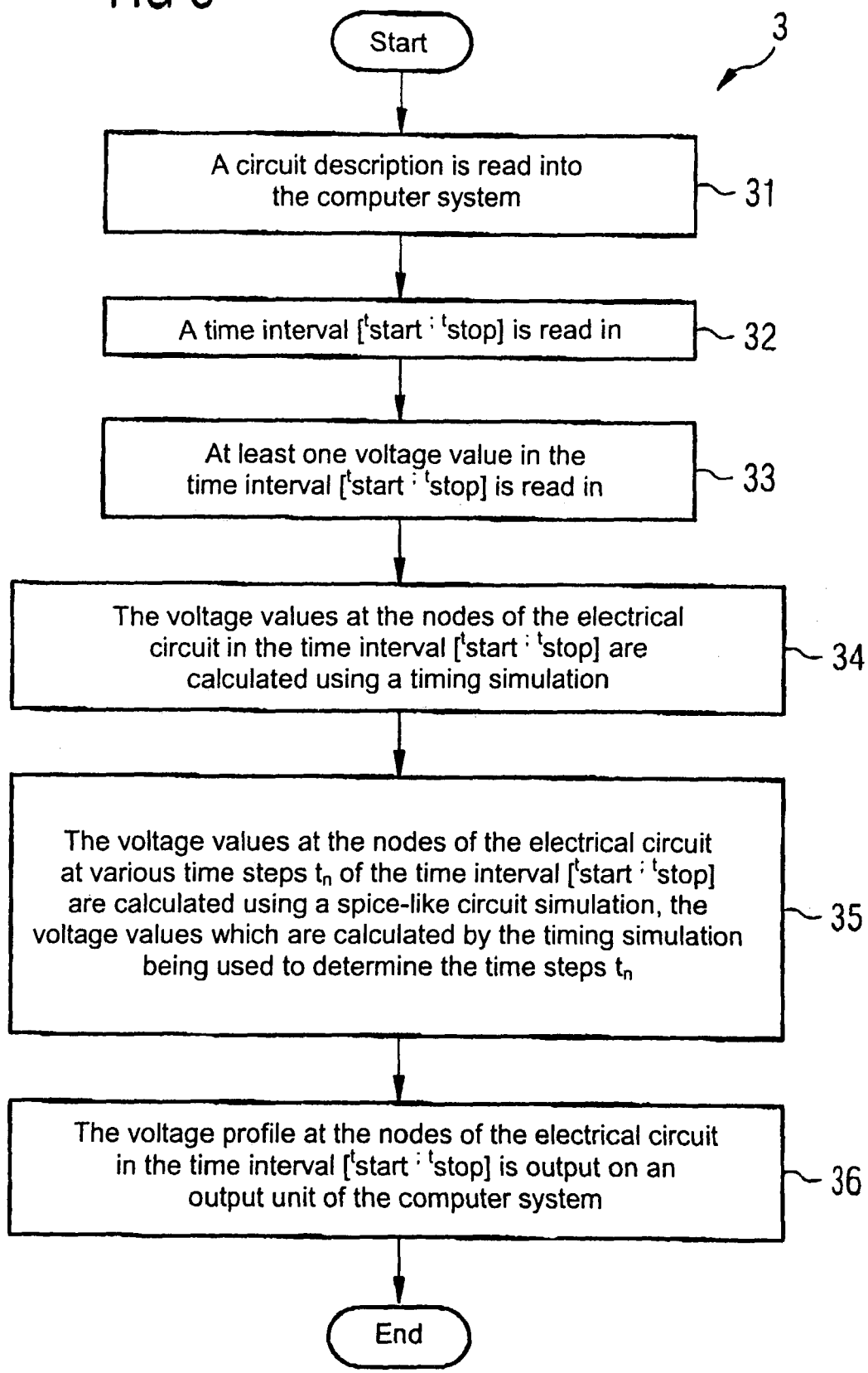

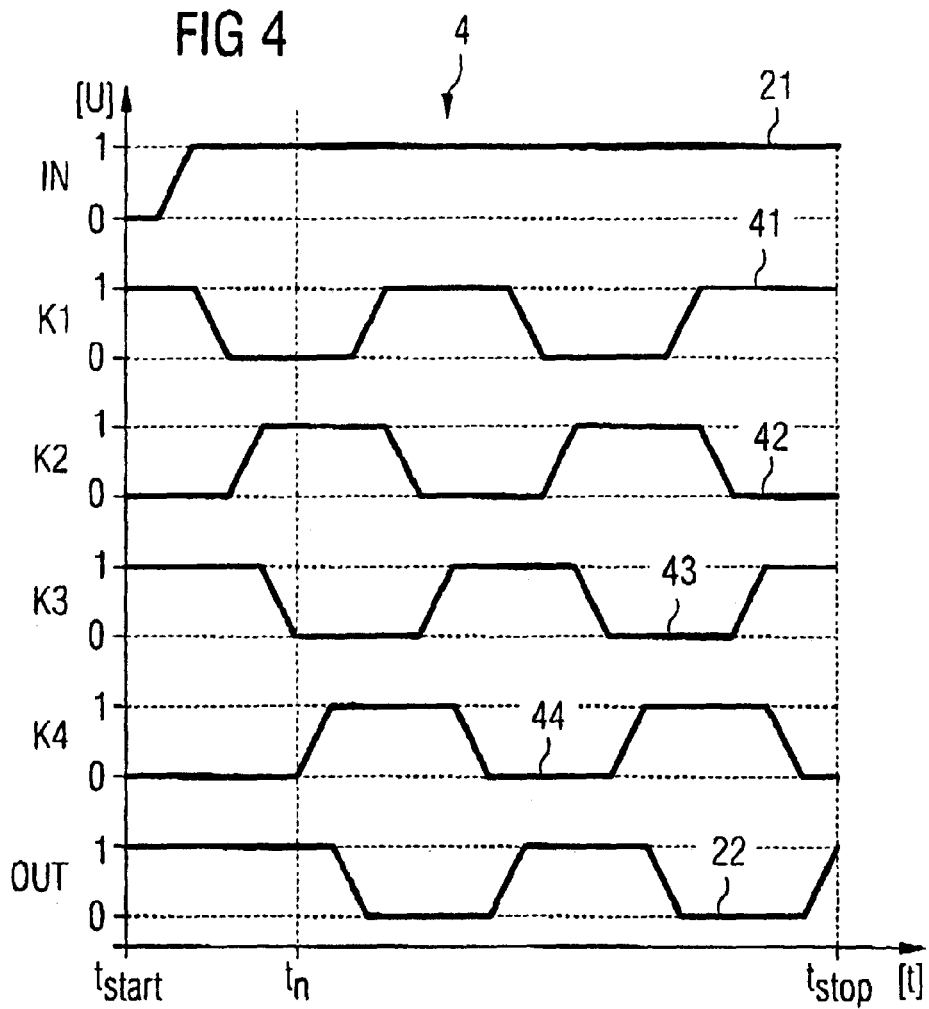
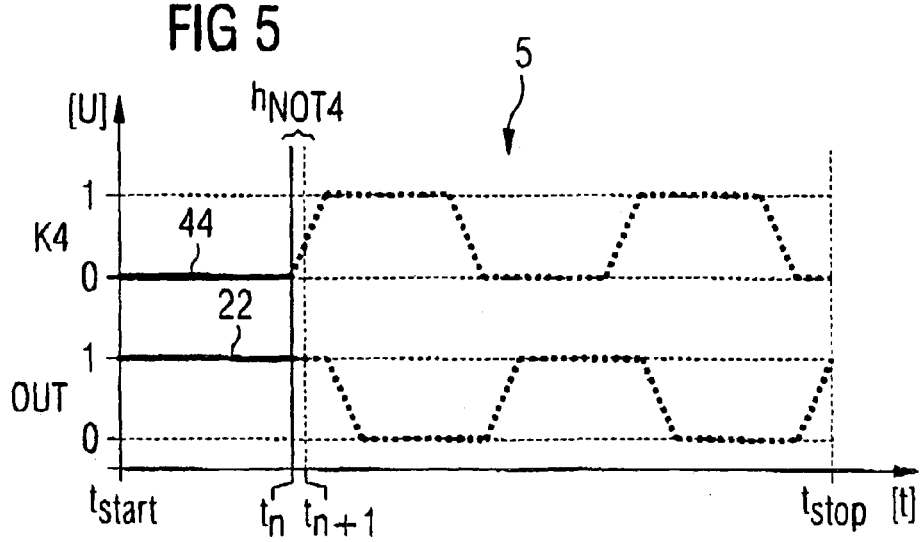

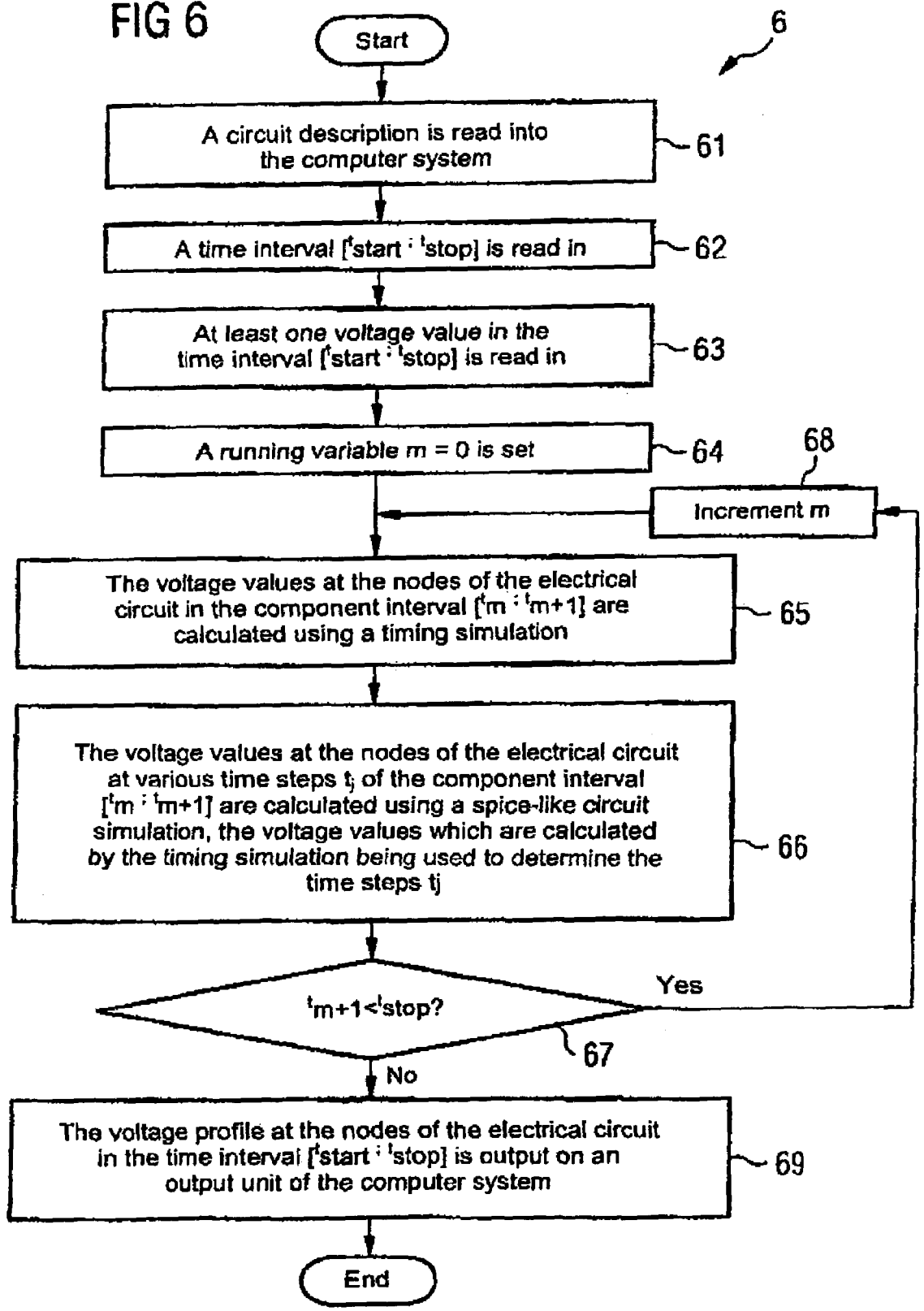

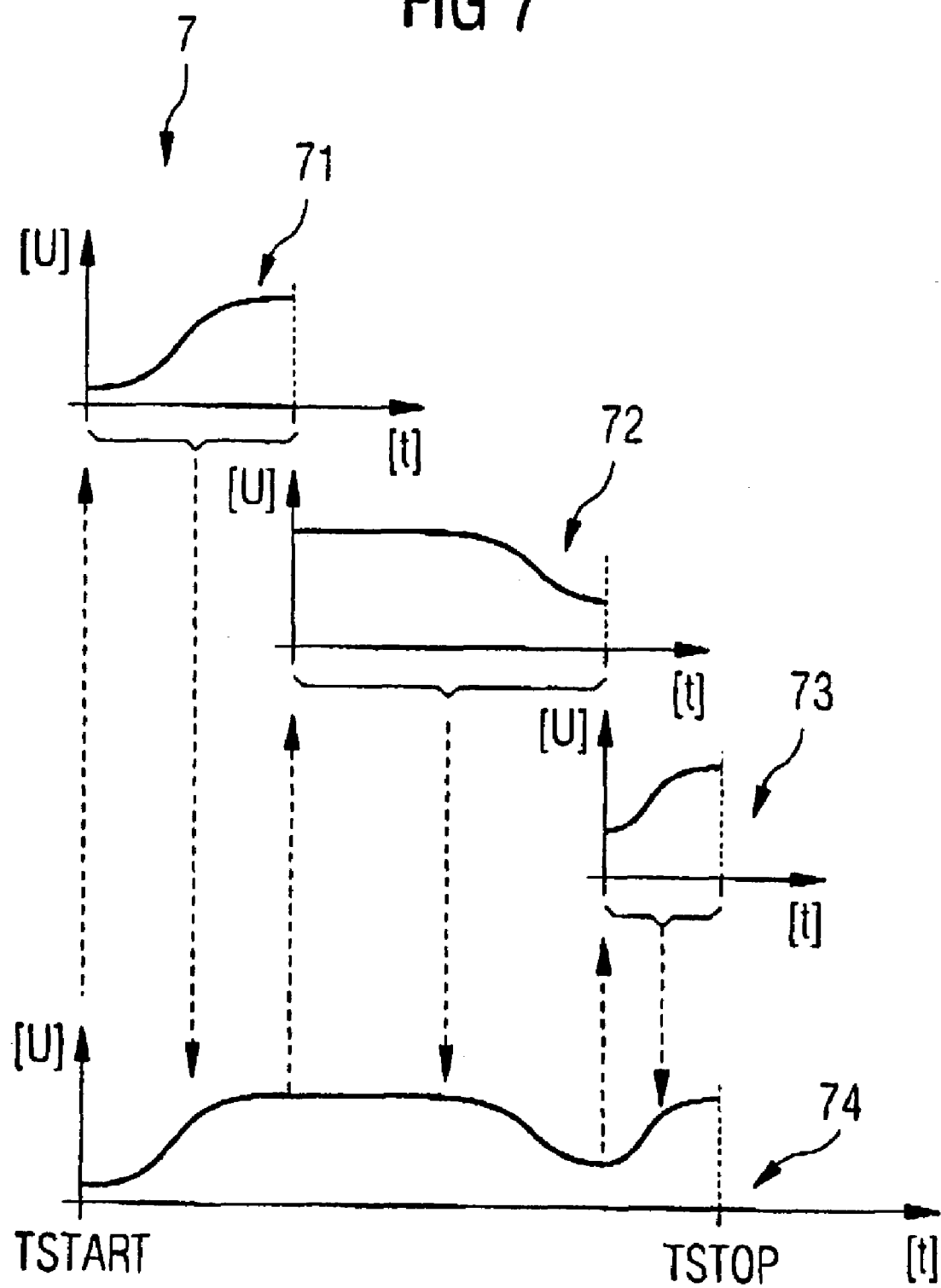

METHOD FOR NUMERICALLY SIMULATING AN ELECTRICAL CIRCUIT

BACKGROUND OF THE INVENTION

Field of the Invention

The invention relates to a method for using a computer system to numerically simulate an electrical circuit. Within the scope of design development for integrated electrical circuits, computer simulation of the electrical behavior of large circuits in the time domain plays a decisive role. It is desirable for the simulation on the computer system to be carried out as quickly as possible and for the results of the simulation to simultaneously have a reliable level of precision.

In the following description, computer simulations should be understood to be simulation methods which run on a computer system and which access a circuit description of a real, electrical circuit that is present in the form of a network list and which calculate the signal profiles, in particular the voltage profiles and/or the current profiles at all of the nodes or at a subset of the nodes of the electrical circuit based on the circuit description used and based on further technologically determined parameters. A simulator is understood to be a computer program which executes such a simulation method.

The document, Chua, L. O.; Lin, P. M.: Computer aided analysis of electronic circuits. Englewood Cliffs, N.J.: Prentice Hall, 1975, discloses what are referred to as timing simulators or TS simulators. These use simple calculation models—for example, based on tables or on neural networks—for individual circuit elements, in particular, for transistors of the electrical circuit, and an event-controlled calculation mode. Although simulations can be carried out relatively quickly using such timing simulators, they entail precision deficits. When the electrical circuits are simulated with such timing simulators, there are frequently deviations of 5 to 10% in the timing structure of the actual signal profiles.

The two documents, Kielkowski, R.: Inside SPICE, New York, McGraw Hill 1994; and Nagel, L. W.: SPICE2, A computer program to simulate semiconductor circuits, Berkeley, University of California, Electronics Research Laboratory, ERL-M 382, 1973, disclose circuit simulators which use very precise, physically based models for the circuit elements, in particular, for the transistors as well as a reliable calculation mode based on systems of differential equations. Such circuit simulators are also referred to as spice circuit simulators or spice-like simulators or as CS circuit simulators. Although circuit simulations carried out with such CS circuit simulators provide precise and reliable results, they require long running times and large resources on the computer system used. Such CS simulators frequently require ten to thirty times as much computing time for simulating the same respective electrical circuit as TS simulators. In addition, only electrical circuits of a specific size and of a specific complexity can be appropriately simulated with such CS circuit simulators.

Hitherto, both simulators were used as individual tools at the user's discretion.

SUMMARY OF THE INVENTION

It is accordingly an object of the invention to provide a method for numerically simulating an electrical circuit and a computer program for performing the method, which overcome the above-mentioned disadvantages of the prior art methods and programs of this general type.

In particular, it is an object of the invention to provide a method with which electrical circuits of any desired size can be reliably simulated with a computer system.

With the foregoing and other objects in view there is provided, in accordance with the invention, a method for using a computer system to numerically simulate an electrical circuit having a plurality of nodes and i circuit elements. The method includes steps of:

a) reading a circuit description of the electrical circuit into the computer system;

b) reading in times $t_{start}$ and $t_{stop}$ of a time interval $[t_{start}; t_{stop}]$;

c) reading in at least one input value for the electrical circuit for at least one specific time in the time interval $[t_{start}; t_{stop}]$; d) calculating voltage values and/or current values at nodes of the electrical circuit at a plurality of times in the time interval $[t_{start}; t_{stop}]$ using models for circuit elements of the electrical circuit;

e) selecting a simulation time $t_n$ in the time interval $[t_{start}; t_{stop}]$;

f) determining system equations of the circuit description for the simulation time $t_n$ such that the circuit elements are described by physical formulas and such that dynamic effects of the circuit elements are described by differential equations;

g) calculating the voltage values and/or the current values at the nodes of the electrical circuit at the simulation time $t_n$ by solving the system equations that were determined in step f);

h) using an equation $t_{n+1}=t_n+h$ for determining a next simulation time $t_{n+1}$ by analyzing the voltage values and/or the current values that were calculated in step d), where $$h = \min_i h_i$$

and $h_i$ is a maximum permitted increment of an i-th one of the circuit elements;

i) repeating steps f) to h) for a simulation time $t_n=t_{n+1}$ until $t_{n+1} \geq t_{stop}$; and j) outputting, on an output unit of the computer system, a profile of the voltage values and/or the current values that were calculated in step g) in the time interval $[t_{start}; t_{stop}]$.

With the foregoing and other objects in view there is provided, in accordance with the invention, a method for using a computer system to numerically simulate an electrical circuit having a plurality of nodes and j circuit elements. The method includes steps of:

a) reading a circuit description of the electrical circuit into the computer system;

b) reading in times $t_{start}$ and $t_{stop}$ of a time interval $[t_{start}; t_{stop}]$;

c) reading in at least one input value for the electrical circuit for at least one specific time in the time interval $[t_{start}; t_{stop}]$;

d) calculating times $t_m$ and $t_{m+1}$ of a component interval $[t_m; t_{m+1}]$ in the time interval $[t_{start}; t_{stop}]$, where m=0;

e) calculating voltage values and/or current values at nodes of the electrical circuit using models for circuit elements of the electrical circuit;

f) in accordance with an equation $t_i = t_{i-1} + h$, where $$h = \min_j h_j$$

and $h_j$ is a maximum permitted increment of the j-th one of the circuit elements, determining a time step $t_i$ or time steps $t_i$ in the component interval $[t_m; t_{m+1}]$ using the voltage values and/or the current values calculated in step e);

g) determining system equations of the circuit description for the time step $t_i$ or the time steps $t_i$ determined in step f) such that the circuit elements are described by physical formulas and such that dynamic effects of the circuit elements are described by differential equations;

h) in the time step $t_i$ or in the time steps $t_i$, calculating the voltage values and/or the current values at the nodes of the electrical circuit by solving the system equations determined in step g);

i) determining times $t_m$ and $t_{m+1}$ of a subsequent component interval $[t_m; t_{m+1}]$ in the time interval $[t_{start}; t_{stop}]$, where m=m+1;

j) repeating steps e) to i) in a loop-like fashion for a plurality of component intervals $[t_m; t_{m+1}]$ in the time interval $[t_{start}; t_{stop}]$ until $t_{m+1} \geq t_{stop}$; and k) outputting, on an output unit of the computer system, a profile of the voltage values and/or the current values that were calculated in step h) in the time interval $[t_{start}; t_{stop}]$.

With the foregoing and other objects in view there is provided, in accordance with the invention, a method for using a computer system to numerically simulate an electrical circuit having a plurality of nodes and j circuit elements. The method includes steps of:

a) reading a circuit description of the electrical circuit into the computer system and selecting a part of the circuit description representing a part of the electrical circuit;

b) reading in times $t_{start}$ and $t_{stop}$ of a time interval $[t_{start}; t_{stop}]$;

c) reading in at least one input value for the electrical circuit for at least one specific time in the time interval $[t_{start}; t_{stop}]$;

d) calculating times $t_m$ and $t_{m+1}$ of a component interval $[t_m; t_{m+1}]$ in the time interval $[t_{start}; t_{stop}]$, where m=0;

e) calculating voltage values and/or current values at nodes of the electrical circuit using models for circuit elements of the electrical circuit;

f) in accordance with an equation $t_i = t_{i-1} + h$, where $$h = \min_j h_j$$

and $h_j$ is a maximum permitted increment of the j-th one of the circuit elements, determining a time step $t_i$ or time steps $t_i$ in the component interval $[t_m; t_{m+1}]$ using the voltage values and/or the current values calculated in step e);

g) determining system equations of the part of the circuit description for the time step $t_i$ or the time steps $t_i$ determined in step f) such that the circuit elements are described by physical formulas and such that dynamic effects of the circuit elements are described by differential equations;

h) in the time step $t_i$ or in the time steps $t_i$, calculating the voltage values and/or the current values at the nodes of the part of the electrical circuit by solving the system equations determined in step g);

i) determining times $t_m$ and $t_{m+1}$ of a subsequent component interval $[t_m; t_{m+1}]$ in the time interval $[t_{start}; t_{stop}]$, where m=m+1;

j) repeating steps e) to i) in a loop-like fashion for a plurality of component intervals $[t_m; t_{m+1}]$ in the time interval $[t_{start}; t_{stop}]$ until $t_{m+1} \geq t_{stop}$; and k) outputting, on an output unit of the computer system, a profile of the voltage values and/or the current values that were calculated in step h) in the time interval $[t_{start}; t_{stop}]$.

In accordance with an added feature of the invention, the circuit description is provided as a network list.

In accordance with an additional feature of the invention, the input value is provided as a voltage value or a current value.

In accordance with another feature of the invention, the models are based on tables or on neural networks.

In accordance with another added feature of the invention, in step g) of the first embodiment of the method or in step h) of the later two embodiments of the method, when the system equations are linear, the voltage values and/or the current values are calculated by numerically calculating the system equations.

In accordance with another additional feature of the invention, in step g) of the first embodiment of the method or in step h) of the later two embodiments of the method, when the system equations are nonlinear, the voltage values and/or the current values are calculated by iteratively calculating the system equations.

In accordance with a further added feature of the invention, in step g) of the first embodiment of the method or in step h) of the later two embodiments of the method, when the system equations are differential equations, the voltage values and/or the current values are calculated by integrating the system equations over time.

In accordance with a yet added feature of either one of the later two embodiments of the method, the method includes between steps h) and i), checking whether a difference between a voltage value and/or a current value calculated in step h) for the time step $t_i$ and a voltage value and/or a current value calculated in step e) for the time step $t_i$ exceeds a predefined value d, and if so, then setting m to a value (m−x) and repeating steps e) to i).

With the foregoing and other objects in view there is provided, in accordance with the invention, a computer readable medium having computer executable instructions for performing an embodiment of the method. The computer readable medium can be a storage medium forming part of a computer system. The computer readable medium can be a computer memory, such as a read only memory, for example. The computer readable medium can also be an electrical signal that is being transmitted.

The inventive method can advantageously be used with a computer system to simulate electrical circuits. For this, it is necessary to provide a circuit description of the electrical circuit on the computer system. This circuit description is present in the form of a network list and includes the individual circuit elements of the electrical circuit and their arrangement with respect to one another. This circuit description may already be present in the form of one or more files in a storage area of the computer system or can be produced again directly using methods known to the person skilled in the art, before the inventive method is executed.

The inventive method starts with the reading in of such a circuit description into the computer system, in particular into a working storage area of the computer system. The electrical circuit on which the circuit description is based has a plurality of nodes and in particular i circuit elements.

Subsequently, a time interval [$t_{start}$; $t_{stop}$] and at least one input value for the electrical circuit, in particular, a voltage value or a current value, are input via a user in this time interval.

After this, the voltage values and/or the current values at the nodes of the electrical circuit in the time interval [$t_{start}$; $t_{stop}$] under consideration are calculated using simple models for the individual circuit elements, in particular, models which are based on tables or on neural networks. In the simulation method used here, in particular a TS simulation is used.

The result of this calculation is represented by the signal curves or wave forms of the calculated output variables, primarily the node voltages for the time interval [$t_{start}$; $t_{stop}$].

Then, the behavior of the same circuit is calculated in the time interval [$t_{start}$; $t_{stop}$], and precise, physically based system equations are produced. The simulator used is in particular a CS simulator. The two simulation approaches of TS simulation and CS simulation operate on the same network list, i.e. they accept the same circuit description with transistors and further circuit elements as input.

First, in this context, a simulation time $t_n$ which is in the direct vicinity of the starting time $t_{start}$ is selected in the time interval under consideration. The system equations of the circuit description are produced for this simulation time $t_n$. Here, the circuit elements are described by physical formulas and the dynamic effects of the circuit elements are described by differential equations. The system equations that are produced in this way are solved, and the voltage values and/or the current values are obtained as a result at the nodes of the electrical circuit at the simulation time $t_n$.

Then, the next simulation time $t_{n+1}$ is determined. Here, waveforms of the voltage values and/or of the current values which are calculated with the TS simulation using simple calculation models are resorted to. The next simulation time $t_{n+1}$ is obtained from the formula:

$$t_{n+1} = t_n + h \text{ where } h = \min_i h_i, . \quad (1)$$

Here, $h_i$ is the maximum permitted increment of the i-th circuit element. This maximum permitted increment results from the already calculated waveforms at the nodes arranged upstream and downstream of the individual circuit elements. When there are voltage signals with a constant profile at the nodes arranged upstream and downstream of a circuit element, a relatively large value is obtained for $h_i$. This means that no CS simulation has to be carried out for this circuit element in the direct vicinity of the time $t_n$. If a voltage signal at a node arranged upstream and downstream of a circuit element has a jump, a change or an activity which is starting, the corresponding value of $h_i$ is made very small, which indicates that a further CS simulation step is to be carried out directly downstream of this time $t_n$.

The inventive method considers the simulation time $t_{n+1}$ which is determined in this way as the next simulation time $t_n$. The inventive method steps for determining and calculating the system equations using the CS simulation and for determining the next simulation time $t_{n+1}$ are repeated until the simulation time $t_{n+1}$ has reached or exceeded the upper value $t_{stop}$ of the time interval [$t_{start}$; $t_{stop}$]. Finally, the profile of the calculated voltage values and/or current values at the nodes of the electrical circuit in the time interval [$t_{start}$; $t_{stop}$] is output on an output unit of the computer system.

This inventive coupling of a TS simulator using simple calculation models to a CS simulator which uses precise, physically based system equations makes it possible to reach a high simulation speed and to reduce the overall computational expenditure while simultaneously maintaining the usual high level of computational precision for CS simulators.

A basic idea of the invention is to use the high simulation speed of simple simulators with a reduced level of precision in order to calculate approximate signal profiles in advance and to derive, from these results, an improved determination of simulation times for a circuit simulation that uses precise system equations. This optimized determination of simulation times permits a significant reduction in the computational expenditure with a constant precision. The signal profiles that are calculated using the TS simulator constitute valuable additional information that is used to avoid unnecessary integration steps and to achieve a saving in terms of a posteriori rejections of time steps and the associated expenditure on repeated calculations. Furthermore, good starting values for the nonlinear Newton iteration are obtained so that a saving in iterations is obtained.

The precision of the simulation results and the resulting computational expenditure are decisively influenced by the modeling approaches used for the circuit elements and by the mathematical algorithms in order to take into account the logical connection of the elements and the timing circuit dynamics.

According to a further basic idea of the invention, it is advantageously possible to use the inventive method to simulate very extensive electrical circuits for which it is not possible to apply an overall simulation with a simulator that exclusively uses precise system equations.

The functionality of a CS simulator is typically divided into a "load and solve" function component and into a further "time step control" function component.

In the "load and solve" function component, the mathematical system equations for a simulation time $t_n$ are set up and solved taking into account the previously calculated times $t_0, \ldots, t_{n-1}$. This includes the complex numerical evaluation of the mathematical formulas of all of the network elements, in particular, the transistors, the diodes, the resistors, the capacitors, the current sources, and the voltage sources. In addition, the dynamic effects of the differential equations are calculated using an integration over time and the non linear system equations are solved iteratively.

The "time step control" function component includes the mathematical error control and the calculation of the time discretization. On the basis of the discrete times $t_0, \ldots, t_n$ which are already calculated, false calculation is used to determine which time $t_{n+1}$ is calculated next. If no additional information is available on the signal profiles occurring after the simulation time $t_n$, in particular, on the current values and voltage values, first an estimation for $t_{n+1}$ is calculated by this function component on the basis of the solutions already used. This is also referred to as an a priori solution.

The "load and solve" function component is subsequently executed at the new simulation time $t_{n+1}$. Then, in a subsequent error control, it is decided whether the solution of $t_{n+1}$ can be accepted. This is also referred to as an a posteriori approach. If the solution is not accepted, the simulation time is reset to a value $t'_{n+1}$ where $t'_{n+1} < t_{n+1}$, and a calculation is carried out again using the "load and solve" function component. With respect to the simulation of the entire time range $t_{start}$ to $t_{stop}$ or the time interval [$t_{start}$; $t_{stop}$], the "time step control" function component decisively influences the number of times it is necessary to carry out the "load and solve" function component.

The essential component of the simulation expenditure of such a CS simulator that takes into account system equations is in the "load and solve" function component. Correspondingly, the overall computational expenditure G of such a simulation is determined essentially by:

$$G = N_T \times C_{LS} \quad (2)$$

$N_T$ being the overall number of discrete time steps determined by the "time step control" function component and $C_{LS}$ being the computational expenditure for the "load and solve" function component.

The significant calculation error of TS simulators is generally the leading or lagging of signals, in particular, of current values and/or of voltage values, and is rarely in qualitatively completely incorrect signal profiles. For this reason, the approximate signal profiles which are calculated by such a TS simulator can be utilized by the "time step control" component of the simulator using system equations, in order to minimize the number $N_T$ of the necessary time steps. Without the knowledge of the signal profiles calculated by such a TS simulator, the simulator using system equations would have to calculate significantly more time steps in order to achieve a similarly high level of precision. If only $M_T$ time steps where $M_T < N_T$ are required because using the signal profiles calculated by the TS simulator, an acceleration of:

$$S = N_T / M_T \quad (3)$$

results because of formula (1). This acceleration can be achieved without losses of precision and merely has to be balanced with the short operating time of the TS simulator for the advance calculation.

The invention also relates to a method in which the TS simulator calculates successive component intervals $[t_m; t_{m+1}]$ of the selected time interval $[t_{start}; t_{stop}]$ and in each case these component intervals $[t_m; t_{m+1}]$ are subsequently treated by the physical CS simulator using system equations. Here, this inventive method corresponds to the previously known method up to the step of reading in at least one input value for the electrical circuit.

A component interval $[t_m; t_{m+1}]$ in the selected time interval $[t_{start}; t_{stop}]$ with the running variable m=0, that is to say the component interval $[t_0; t_1]$, is then determined. In this component interval $[t_m; t_{m+1}]$, the TS simulator calculates the voltage values or the current values at the nodes of the electrical circuit. The determination of the component interval $[t_m; t_{m+1}]$ and the calculation of the voltage values and the current values at the nodes of the electrical circuit in this component interval $[t_m; t_{m+1}]$ can be prompted by the simulator which uses system equations.

In a subsequent method step, at least one time step $t_i$ is determined in this component interval $[t_m; t_{m+1}]$, the voltage values and/or current values which are calculated by the TS simulator being used to define a minimum number of time steps $t_j$ to be considered. Here, the procedure adopted is as already presented, the equation (1) being appropriately used.

For the time step $t_i$ that is determined in this way or for the time steps $t_i$ that are determined in this way, the system equations of the circuit description are determined in the component interval under consideration and are solved. The voltage values and/or the current values at the nodes of the electrical circuit are obtained in the time step $t_i$ or in the time steps $t_i$.

Then, the calculation of the next component interval $[t_m; t_{m+1}]$ in the time interval $[t_{start}, t_{stop}]$ under consideration where m=m+1 is prompted by the simulator which uses system equations. Here, the method steps: of the calculation of the voltage values and/or of the current values by the TS simulator, of the determination of at least one time step $t_i$, of the determination of the system equations of the circuit description, of the calculation of the voltage values and/or of the current values from these system equations, and of the determination of the respective subsequent component interval $[t_m; t_{m+1}]$ are repeated in a loop-like fashion. This loop-like repetition takes place until the simulation time $t_{stop}$ is reached. Finally, the profile of the calculated voltage values and/or current values at the nodes of the electrical circuit is output on an output unit of the computer system in the time interval $[t_{start}; t_{stop}]$ under consideration.

A basic idea of this inventive method is that the TS simulator functions as a server and repeatedly receives instructions such as "simulate a time interval with a starting time $t_i$ and with a starting state $V_1$ and with a stop time $t_2$". The CS simulator transverses such simulation intervals to the TS simulator and receives signal profiles of voltage values and/or current values from the TS simulator for further processing. As a result of this interaction between the two simulators, the signal profiles that are calculated by the TS simulator are used and further processed particularly effectively. Computational precision and simulation speed can be adjusted very precisely when this method is used.

Furthermore, this inventive method calculates critical time periods by taking into account a plurality of very short time steps very precisely, a small number of critical time periods of the simulation being taken into account by the small number of relatively long time steps. As a result, precise adaptation of the simulation precision to the respective complexity of the simulation at the time under consideration is possible in a particularly advantageous way.

It is particularly advantageous if the starting time $t_1$ of the first component interval $[t_m; t_{m+1}]$ under consideration is equal to the starting time $t_{start}$ of the entire time interval $[t_{start}; t_{stop}]$ under consideration. Complete coverage of the time interval under consideration is then provided.

According to one embodiment of the invention, instead of the method steps of the reading in of a circuit description, the determination of the system equations and the calculation of the voltage values and/or of the current values by solving the system equations, the following steps are carried out:

First, a component circuit is defined within the read-in circuit description, the signal profiles of which are particularly critical in terms of the precision requirements, and therefore have to be calculated with the high degree of precision of the CS simulator. Here, the overall circuit is embodied in such a way that the calculation precision of the other circuit elements only has a small influence on the computational precision of the selected component circuit. The signals, in particular, the voltage values and the current values of the other circuit elements, are included in the calculation of the component circuit in order to ensure correct peripheral conditions for the precise calculation of the selected component circuit.

In this embodiment of the invention, the entire electrical circuit is calculated by the TS simulator. The component circuit is determined by the CS simulator. Here, the system equations that are used by the CS simulator are determined only for the selected part of the circuit description in the time step $t_i$ or time steps $t_i$ under consideration. These system equations are solved, and the precise signal profiles, in particular, the precise voltage values and current values in the selected circuit part are obtained. Here, the number of time steps is minimized by using the approximate signal profiles determined by the TS simulator.

In this embodiment of the invention it is advantageous that only the selected component circuit is calculated with the increased computational expenditure of the simulator which uses system equations. The other areas of the electrical circuit are calculated exclusively with the TS simulator. Nevertheless, the precision of the calculation results is very high because the critical circuit part is subject to the precision control of the CS simulator which uses system equations. A further advantage of this inventive method is that much larger electrical circuits can be calculated with the high precision of CS simulators that use system equations than would be possible by exclusively using a CS simulator. In particular, electrical circuits for which it is sufficient to restrict the high calculation precision to a critical circuit part that is defined at the user end are particularly advantageous and can be simulated in a particularly precise way.

One advantageous development of the inventive method provides the following checking step after the voltage values and/or the current values have been calculated by solving the previously set-up system equations: in this checking step, the difference between the voltage value and/or current value determined using system equations and the voltage value and/or current value that is calculated using simple calculation models is calculated for, in each case, a corresponding time step or time $t_i$. If this difference exceeds a predefinable value d, the running variable m is reduced by a value x which can also be predefined and the method steps are repeated starting with the calculation of the voltage values and/or the current values using the TS simulation.

This additional fault control in the respective current time interval provides a further improvement in the precision of the calculated voltage values and/or current values. If in fact, the deviations of the simulation values calculated by using system equations with respect to the simulation values determined by using simple calculation models become too large, a restart of the calculation of voltage values and/or current values for a reset time is brought about. In this case, the time intervals that are calculated in succession by the TS simulator may overlap.

As a result, the entire electrical circuit or the critical part of the circuit is subject to an additional fault monitoring operation, and reactions of faulty signal profiles are avoided both in the circuit as a whole and in the other circuit components—when a critical component circuit is considered. This automatic fault correction possibility ensures further improvement of the precision of the calculated voltage values and/or current values with an optimized simulation speed. Divergence of the signal profiles calculated by the CS simulation and by the TS simulation can thus easily be avoided.

According to a further embodiment of the invention, the voltage values and/or current values at the nodes of the part of the electrical circuit or at the nodes of the electrical circuit are determined by solving the set-up system equations during the CS simulation in such a way that the linear system equations are numerically calculated, the nonlinear system equations are iteratively calculated and the system equations which are present as differential equations are solved by an integration over time.

Combining these calculation methods ensures a way of calculating very precise voltage values and/or current values which is optimum in terms of speed.

The inventive method can then be used in a particularly advantageous way if at least one circuit element of the electrical circuit is embodied as a transistor. The behavior of such transistors can be determined precisely only with a large degree of computational expenditure. Correspondingly, simple calculation models that are based, in particular, on tables or on neural networks are often used to predict the behavior of transistors. In the inventive method, such simple calculation models for transistors are often used as a basis, and precise current values and/or voltage values are determined for specific time steps $t_i$ by determining and calculating system equations. As a result, transistors can be simulated in a way which is optimum in terms of speed and is at the same time precise.

Algorithmic concepts other than those explicitly mentioned are also conceivable for combining CS simulators with TS simulators. These are also covered by the inventive idea of combining CS simulators with TS simulators.

According to a further aspect of the invention, the problem that the signal profiles calculated by the TS simulation have time errors in the range of 5-10% can be solved by a corresponding forward correction of an input activity that is expected on the time axis. The associated reduction in the effectiveness of the combination can be corrected again by the interaction of the TS simulator with the CS simulator that is described above.

The invention is also implemented in a computer program for carrying out the method for simulating an electrical circuit. The computer program contains program instructions which prompt a computer system to execute an embodiment of the method described above. The computer program consequently outputs the calculated voltage values and/or current values to the nodes of the electrical circuits in the time interval under consideration on an output unit, in particular, on a screen or on a printer. On the basis of the calculated voltage values and/or current values, a prediction can be made as to whether such an electrical circuit is to be manufactured or an electrical circuit which is actually present is to be modified if appropriate.

The computer program that is improved according to the invention results in the simulation of electrical circuits which is more faithful to reality and more precise, and results in an improvement in the operating time in comparison with the known methods for simulating electrical circuits. Furthermore, the computer program which is improved according to the invention can also simulate extensive and complex electrical circuits which it was previously impossible to simulate with the known methods for simulating electrical circuits.

The invention also relates to a computer program which is contained in a storage medium, which is stored in a computer memory, which is contained in a read-only memory or which is transmitted on an electrical carrier signal.

A known TS simulator is Nanosim from Synopsys. Known CS simulators are HSPICE™ from Synopsys and Titan™ from Infineon.

The invention also relates to a computer readable medium or a carrier medium, in particular a data carrier, for example, a diskette, a zip drive, a streamer, a CD ROM or a DVD ROM on which the computer program described above is stored. In addition, the invention relates to a computer system on which such a computer program is stored. Finally, the invention relates to a method in which such a computer program is downloaded from an electronic data network, for example, from the Internet, onto a computer which is connected to the data network.

Other features which are considered as characteristic for the invention are set forth in the appended claims.

Although the invention is illustrated and described herein as embodied in a method for numerically simulating an electrical circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 3 is a first flowchart of a first exemplary embodiment of the method;

FIG. 4 is a second representation of the voltage profile of the ring oscillator shown in FIG. 1 obtained as a function of time using the first exemplary embodiment of the method;

FIG. 5 is a representation of the simulation state of the ring oscillator shown in FIG. 1 at the time $t_n$ using the first exemplary embodiment of the method;

FIG. 6 is a flowchart of a second exemplary embodiment of the method; and

FIG. 7 is a representation of simulation linking according to the second exemplary embodiment of the method.

DESCRIPTION OF THE PREFERRED EMBODIMENTS

Figure 1:
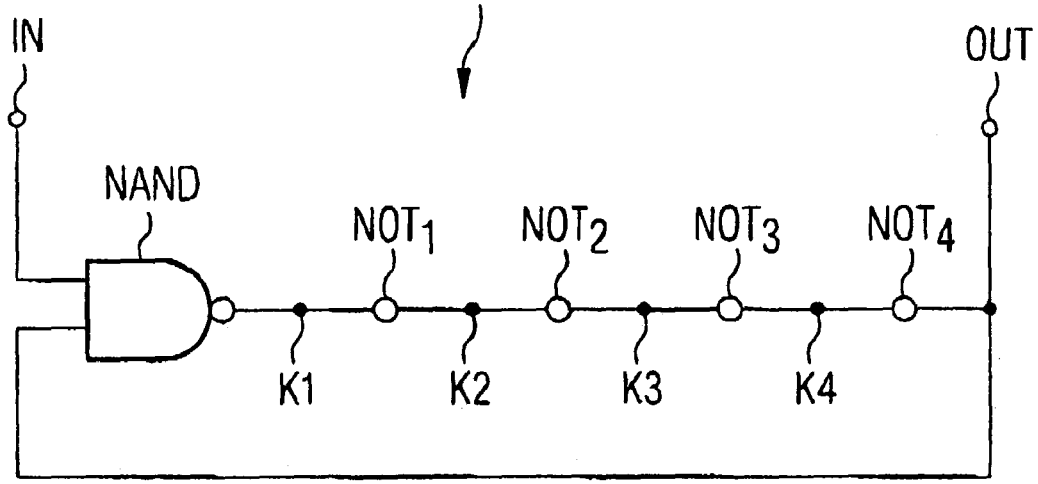
FIG. 1 is a schematic representation of a ring oscillator.

Referring now to the figures of the drawing in detail and first, particularly, to FIG. 1 thereof, there is shown a ring oscillator 1 having, in succession, an NAND gate, a first inverter NOT1, a second inverter NOT2, a third inverter NOT3 and a fourth inverter NOT4. A first node K1 is arranged between the NAND gate and the first inverter NOT1, a second node K2 between the first inverter NOT1 and the second inverter NOT2, a third node K3 between the second inverter NOT2 and the third inverter NOT3, and the fourth node K4 between the third inverter NOT3 and a fourth inverter NOT4. Upstream of the NAND gate there is an input node IN and downstream of the fourth inverter NOT4 there is an output node OUT. The output node OUT is connected for feedback to the NAND gate which is provided for starting the oscillation and for feeding back the signals present at the output node OUT.

Figure 2:
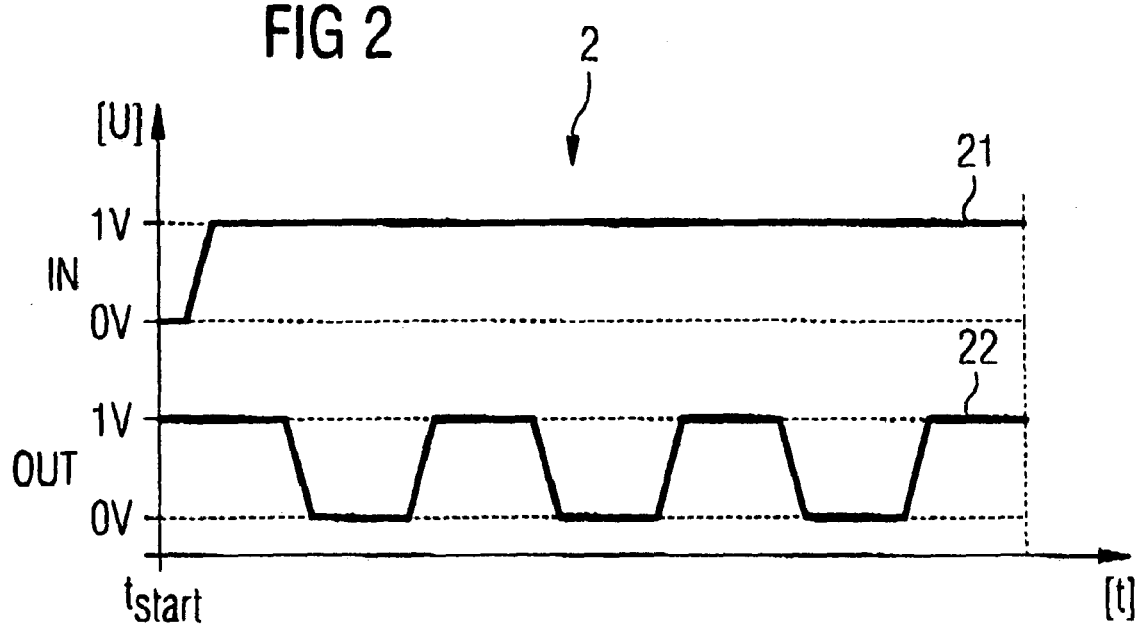
FIG. 2 is a first representation of the voltage profile of the ring oscillator shown in FIG. 1 as a function of time.

FIG. 2 shows a first representation 2 of the voltage profile of the ring oscillator 1 as a function of time. The first representation 2 of the voltage profile is divided here into an input voltage profile 21 and into an output voltage profile 22 which are arranged one on top of the other in a common diagram for the sake of better clarity.

The input voltage profile 21 represents the qualitatively correct time profile of the voltage which is present at the input node IN of the ring oscillator 1. At a time $t_{start}$, a voltage of 0V is present at the input node IN, and afterward the input voltage rises with a constant gradient of 80° in a brief time interval until it reaches the value 1V. Starting from this time, the input voltage present at the input node IN remains constant.

The output voltage profile 22 represents the qualitatively correct time profile of the voltage which is present at the output node OUT of the ring oscillator 1. The output voltage profile 22 has a zigzag-shaped oscillation with a constant period, assuming a value of 1V at the time $t_{start}$ and subsequently alternately assuming values 0V and 1V. In the respective short transition phases between the voltage values 0V and 1V, the output voltage profile 22 has a constant gradient of −80° and +80°, respectively.

The signal levels of the input voltage profile 21 and of the output voltage profile 22 of 0V and 1V, respectively, correspond respectively to the logic states "False" and "True".

FIG. 3 shows a first flowchart 3 of a first exemplary embodiment of the inventive method.

This embodiment of the invention is a two-phase simulation of the complete time interval $[t_{start}; t_{stop}]$. The method steps 31 to 36 which are represented in FIG. 3 have to be executed in succession here.

In a first method step 31, a circuit description is first read into the computer system and is prepared for simulation. A time interval $[t_{start}; t_{stop}]$ is read into the computer system in the second method step 32, and at least one voltage value is read into the computer system in the third method step 33 in this time interval $[t_{start}; t_{stop}]$.

In the fourth method step 34, the voltage values at the nodes of the electrical circuit are calculated in the selected time interval with a TS simulation. As a result, this TS simulation supplies the signal curves of the calculated output variables, and in the present exemplary embodiment it supplies the node voltages in the time interval $[t_{start}; t_{stop}]$.

In the subsequent fifth method step 35, the same electrical circuit is simulated in a second pass. Voltage values at the nodes of the electrical circuit are calculated at various time steps $t_n$ of the time interval $[t_{start}; t_{stop}]$. The CS simulation determines the time steps $t_n$ to be considered by using the voltage values calculated previously by the TS simulation. The voltage values which are calculated in this way have a higher level of precision and proximity to reality than the voltage values calculated previously with the TS simulation.

In the concluding method step 36, the profile of the voltage values which is calculated at the node of the electrical circuit in the time interval $[t_{start}; t_{stop}]$ under consideration is output on an output unit of the computer system.

FIG. 4 shows a second representation 4 of the voltage profile of the ring oscillator 1 as a function of time in accordance with the first exemplary embodiment of the method. The voltage profiles illustrated in FIG. 4 result from a calculation using a TS simulation.

The second representation 4 of the voltage profile is divided into the input voltage profile 21 shown in FIG. 2, into a first node voltage profile 41, into a second node voltage profile 42, into a third node voltage profile 43, into a fourth node voltage profile 44 and into the output voltage profile 22 represented in FIG. 2. For reasons of clarity, these representations of the voltage profile are arranged one on top of the other in a diagram. The time axis is plotted in the horizontal direction and the voltage in the vertical direction.

In FIG. 4, the time interval between the starting value $t_{start}$ and the end value $t_{stop}$ is considered in the second representation 4 of the voltage profile. Here, the node voltage profiles 41-44 represent the voltage profile at the nodes K1, K2, K3 and K4 of the ring oscillator 1.

The first node voltage profile 41 results from the output voltage of the NAND gate as a function of the voltages present at the input node IN and at the output node OUT in the time domain. The first node voltage profile 41 has the same period as the output voltage profile 22 and assumes the voltage values 1V and 0V alternately.

The second node voltage profile 42 is represented in mirror-inverted fashion with respect to the first node voltage profile 41 such that it always assumes a voltage value of 0V or 1V whenever the first node voltage profile 41 assumes a voltage value of 1V or 0V. In comparison with the first node voltage profile 41, the second node voltage profile 42 is represented displaced to the right on the time axis t by an amount equal to the duration of the transition phase between the voltage values 1 and 0 or 0 and 1, respectively.

The third node voltage profile 43 is represented in mirror-inverted fashion with respect to the second node voltage profile 42 and is displaced to the right on the time axis by an amount equal to the duration of the transition phase between the voltage values 1 and 0 or 0 and 1, respectively.

The fourth node voltage profile 44 is represented in mirror-inverted fashion with respect to the third node voltage profile 43 and is displaced to the right by an amount equal to the duration of the transition phase between the voltage values 1V and 0V or 0V and 1V, respectively.

At the start of the first transition from the voltage value 0V to the voltage value 1V of the fourth node voltage profile 44, a simulation time $t_n$ which is under consideration is shown by a vertical dashed line.

FIG. 5 shows a representation 5 of the simulation state of the ring oscillator 1 at the time $t_n$ according to the first exemplary embodiment.

The representation 5 of the simulation state constitutes the CS simulation of the fourth node voltage profile 44 and of the output voltage profile 22 at the time $t_n$ which is in the first quartile of the interval $[t_{start}; t_{stop}]$.

Here, the representation of the fourth node voltage profile 44 and of the output voltage profile 22 which respectively continue in the time interval $[t_{start}; t_n]$ symbolizes that the fourth node voltage profile 44 and the output voltage profile 22 have already been calculated by the CS simulation by the time $t_n$. The representation of the fourth node voltage profile 44 and of the output voltage profile 22, each interrupted between the time $t_n$ and the end time $t_{stop}$, symbolizes that voltage values which were previously only calculated by the TS simulation are available for this range.

Starting from the time $t_n$, a further time $t_{n+1}$ is displaced to the right by an amount equal to $h_{NOT4}$, represented in FIG. 5 by a vertical line.

The mode of operation of the method represented in FIG. 3 using the first flowchart 3 is represented below using the exemplary embodiment of the ring oscillator 1 shown in FIG. 1, with reference to FIGS. 1 to 5.

According to the first flowchart 3 shown in FIG. 3, the circuit description of the ring oscillator 1 which is present as the network list is first read into a computer system which is not shown here. Then, the time interval $[t_{start}; t_{stop}]$ which is under consideration and the input voltage profile 21 which is shown in FIG. 2 are read into the computer system.

The voltage values are then calculated at the first node K1, at the second node K2, at the third node K3, at the fourth node K4 and at the output node OUT by a TS simulation. This TS simulation resorts, for this purpose, to table-based behavior models of the NAND gate, of the first inverter NOT1, of the second inverter NOT2, of the third inverter NOT3 and of the fourth inverter NOT4. Such table-based behaviour models and the execution of such TS simulation are known to a person skilled in the art and do not need to be explained further here.

The voltage profiles 21, 22, 41, 42, 43 and 44 shown in FIG. 4 are obtained as a result of this TS simulation and will be explained in brief below.

Before the oscillation starts, a voltage of 0V is present at the input node IN of the ring oscillator 1. As a result, the state TRUE or the voltage of 1V is obtained for the first node K1. Accordingly, a voltage of 0V is obtained at the second node K2, a voltage of 1V at the third node K3, a voltage of 0V at the fourth node K4 and a voltage of 1V at the output node OUT. Because of the signal transit time, a delay occurs in each case until these voltages are present at the respective nodes.

The input voltage at the input node IN is then set to the value 1V as shown in FIG. 2. This gives rise, with a delay due to the signal transit time at the nodes K1 to K4 and at the input node OUT, to a change in the voltage applied so that a voltage of 0V is present at the output node OUT. This voltage is fed back to the NAND gate so that the state of the first node changes to TRUE or to 1V.

After a further time delay, the output node OUT is thus also reset to the value TRUE or to the voltage 1V. This results in an oscillation for the ring oscillator 1 whose frequency depends on the number of inverters and their signal transit times.

The behavior of the respective actual NAND gate and of the respective actually present inverters NOT1 to NOT4 is described in an idealized way by the table-based modeling of the individual inverters and of the NAND gate by using the TS simulation. For a simulation which is as true as possible to reality, these results are used for efficiently determining the time steps or time step control of a subsequent CS simulation. This determination of the time steps is carried out with a CS simulation taking into consideration the LTE or the local truncation error of the integration formulas, as has been explained in Chua et al. and in Kielkowski, which are incorporated herein by reference.

Here, a formation of minimum values over all the differential circuit elements takes place, in particular, over all the capacitors, inductors and transistors according to formula (1):

$$t_{n+1} = t_n + h \text{ where } h = \min_i h_i,$$

$h_i$ being the maximum permitted increment of the i-th circuit element. Here, the variable $h_i$ specifies when a signal change occurs at the respective circuit element and the integration error reaches the permitted upper limit. Accordingly, the time step $t_{n+1}$ is selected such that it is as large as possible, but still guarantees compliance with the predefined calculation precision.

In the present inventive method, the quality of the estimation of the integration error which is associated with a specific time step $h_i$ for a specific circuit element i is particularly advantageously possible. This can be seen particularly well in FIG. 5 by reference to the fourth inverter NOT4 and by reference to the fourth node voltage profile 44. Here, the simulation time $t_n$ is considered. The next time step $t_{n+1}$ will now be determined, $t_{n+1} = t_n + h$, where $h = \min(h_{NAND}, h_{NOT1}, h_{NOT2}, h_{NOT3}, h_{NOT4})$.

The node voltages which are already calculated with the TS simulation and are shown in FIG. 4 can be used for the calculation of the permitted increments $h_{NAND}$, $h_{NOT1}$, $h_{NOT2}$, $h_{NOT3}$, $h_{NOT4}$. These node voltages are not available if only a CS simulation is carried out. It is in fact impossible to detect any imminent activity from a consideration of the fourth node voltage profile 44 and of the output voltage profile 22 before the simulation time $t_n$.

The maximum permitted increment $h_{NAND}$ for the NAND gate is obtained from a consideration of the input voltage profile 21, of the output voltage profile 22 and of the first node voltage profile 41. The maximum permitted increment $h_{NOT1}$ for the first inverter NOT1 is obtained from a consideration of the first node voltage profile 41 and of the second node voltage profile 42. The maximum permitted increment $h_{NOT2}$ for the second inverter NOT2 is obtained from a consideration of the second node voltage profile 42 and of the third node voltage profile 43. The maximum permitted increment $h_{NOT3}$ for the third inverter NOT3 is obtained from a consideration of the third node voltage profile 43 and of the fourth node voltage profile 44. The maximum permitted increment $h_{NOT4}$ for the fourth inverter NOT4 is obtained from the fourth node voltage profile 44 and from the output voltage profile 22.

FIG. 4 shows particularly clearly that, at the time $t_n$, the fourth node voltage profile 44 is the node voltage profile which is the next one to have a signal change. Accordingly, the maximum permitted time step $h_{NOT3}$ for the third inverter NOT3, and $h_{NOT4}$ for the fourth inverter NOT4 are smaller than the maximum permitted time steps of the NAND gate, of the first inverter NOT1 and of the second inverter NOT2.

For this reason, the fourth inverter NOT4 according to FIG. 5 is considered by way of example below. At the time $t_n$, the fourth node voltage profile 44 which is illustrated by a continuous line and the output voltage profile 22 which is illustrated by a continuous line are available. The profiles 44, 22 have already been calculated using the TS simulation. At the time $t_n$, an activity which is beginning occurs at the input of the fourth inverter NOT4. Accordingly, the value $h_{NOT4}$ is set to a very small predefined value. The next time step $t_{n+1}$ is thus calculated as the sum of $t_n+h_{NOT4}$.

The CS simulation then calculates the precise voltage value at the input node IN, at the output node OUT and at the nodes K1 to K4 for the next simulation time $t_{n+1}$.

After this calculation, the method continues with the determination of the next time $t_{n+1}$ and with the calculation of the precise node voltage values for this time $t_{n+1}$. This is repeated until the final value $t_{stop}$ of the time interval [$t_{start}$; $t_{stop}$] is reached. Finally, the node voltage profiles are output on the screen of the computer system. These correspond approximately to the node voltage profiles in FIG. 4 in the present exemplary embodiment. For this reason, a separate representation of these node voltage profiles calculated by the CS simulation is not given.

FIG. 6 shows a second flowchart representing a second exemplary embodiment of the inventive method having method steps 61 to 69.

The method steps 61 to 63 correspond to method steps 31 to 33 of the first flowchart 3. In the next method step 64, a running variable m is set to the value 0. In the fifth method step 65, a component interval [$t_0$; $t_1$] of the selected time interval [$t_{start}$; $t_{stop}$] is selected and the voltage values at the nodes of the electrical circuit in this component interval [$t_0$; $t_1$] are calculated using a TS simulation. In the sixth method step 66, time steps $t_i$ are determined in this component interval using the voltage values calculated by the TS simulation, and a CS simulation is carried out at these time steps $t_i$.

Afterward, further component intervals [$t_m$; $t_{m+1}$] are considered, the running variable m having been previously incremented in the eighth method step 68.

The voltage values of the nodes of the electrical circuit in the component interval [$t_m$; $t_{m+1}$] which are respectively under consideration are always first calculated with a timing simulation. Using the voltage values that are calculated in this way, time steps $t_i$ at which a CS simulation is carried out are determined within this component interval [$t_m$; $t_{m+1}$].

The method steps 65 to 68 are carried out in a loop-like fashion until all the component intervals [$t_m$; $t_{m+1}$] of the time interval [$t_{start}$; $t_{stop}$] under consideration have been considered. Finally, the voltage profile at the nodes of the electrical circuit in the time interval is output on an output unit of the computer system.

FIG. 7 shows a representation 7 of the simulation combination obtained with the second exemplary embodiment.

The representation 7 of the simulation combination is divided into a first TS simulation 71, a second TS simulation 72, a third TS simulation 73 and a CS simulation 74. The CS simulation controls the sequence of the simulation calculations of the TS simulations in the individual component intervals and also defines the size of the component intervals.

The signal profiles which are respectively calculated by the TS simulations are used by the "time step control" function component of the CS simulation—as shown in the first exemplary embodiment—in order to achieve a high degree of precision in the respective component intervals under consideration with a minimum number of time steps.

It is also conceivable for the deviations between the values calculated in the TS simulation and those calculated in the CS simulation for the same respective time to be checked. If this deviation is too large, the CS simulation can be reset and repeated, in particular with finer gradation of the times $t_n$. It is also conceivable that in each case the entire electrical circuit is calculated by the timing simulation, and only a critical range of the electrical circuit is calculated by the CS simulation. The client-server-like interaction of the TS simulation with the CS simulation which is outlined in FIG. 7 can advantageously be carried out in both abovementioned developments of the invention.

We claim:

1. A method for using a computer system to numerically simulate an electrical circuit having a plurality of nodes and i circuit elements, the method which comprises:
    a) reading a circuit description of the electrical circuit into the Computer system;
    b) reading in times $t_{start}$ and $t_{stop}$ of a time interval [$t_{start}$; $t_{stop}$];
    c) reading in at least one input value of a voltage and current for the electrical circuit for at least one specific time in the time interval [$t_{start}$; $t_{stop}$];
    d) calculating voltage values and/or current values at nodes of the electrical circuit at a plurality of times in the time interval [$t_{start}$; $t_{stop}$] using models for circuit elements of the electrical circuit;
    e) selecting a simulation time $t_n$ in the time interval [$t_{start}$; $t_{stop}$];
    f) determining system equations of the circuit description for the simulation time $t_n$ such that said circuit elements are described by physical formulas and such that dynamic effects of said circuit elements are described by differential equations;
    g) calculating the voltage values and/or the current values at said nodes of said electrical circuit at the simulation time $t_n$ by solving the system equations that were determined in step f), the voltage values and/or the current values being calculated at the same nodes as in step d);
    h) using an equation $t_{n+1}=t_n+h$ for determining a next simulation time $t_{n+1}$ by analyzing the voltage values and/or the current values that were calculated in step d), $$h = \min_i h_i$$

and $h_i$ is a maximum permitted increment of an i-th one of the circuit elements;

i) repeating steps f) to h) for a simulation time $t_n=t_{n+1}$ until $t_{n+1} \geq t_{stop}$; and j) outputting, on an output unit of the computer system, a profile of the voltage values and/or the current values that were calculated in step g) in the time interval $[t_{start}; t_{stop}]$.

2. The method according to claim 1, which further comprises providing the circuit description as a network list.

3. The method according to claim 1, which further comprises providing the input value as a voltage value or a current value.

4. The method according to claim 1, which further comprises basing the models on tables or on neural networks.

5. A computer readable storage medium having computer executable instructions for performing a method with a computer system in order to numerically simulate an electrical circuit having a plurality of nodes and i circuit elements, the method which comprises:

a) reading a circuit description of the electrical circuit into the computer system;

b) reading in times $t_{start}$ and $t_{stop}$ of a time interval $[t_{start}; t_{stop}]$;

c) reading in at least one input value of a voltage and current for the electrical circuit for at least one specific time in the time interval $[t_{start}; t_{stop}]$;

d) calculating voltage values and/or current values at nodes of the electrical circuit at a plurality of times in the time interval $[t_{start}; t_{stop}]$ using models for circuit elements of the electrical circuit;

e) selecting a simulation time $t_n$ in the time interval $[t_{start}; t_{stop}]$;

f) determining system equations of the circuit description for the simulation time $t_n$ such that said circuit elements are described by physical formulas and such that dynamic effects of said circuit elements are described by differential equations;

g) calculating the voltage values and/or the current values at said nodes of said electrical circuit at the simulation time $t_n$ by solving the system equations that were determined in step f), the voltage values and/or the current values being calculated at the same nodes as in step d);

h) using an equation $t_{n+1}=t_n+h$ for determining a next simulation time $t_{n+1}$ by analyzing the voltage values and/or the current values that were calculated in step d), where $$h = \min_i h_i$$

and $h_i$ is a maximum permitted increment of an i-th one of the circuit elements;

i) repeating steps f) to h) for a simulation time $t_n=t_{n+1}$ until $t_{n+1} \geq t_{stop}$; and j) outputting, on an output unit of the computer system, a profile of the voltage values and/or the current values that were calculated in step g) in the time interval $[t_{start}; t_{stop}]$.

6. The computer readable storage medium according to claim 5, wherein the computer readable storage medium is a computer memory.

7. The computer readable storage medium according to claim 5, wherein the computer readable storage medium is a read-only memory.

8. The computer readable storage medium according to claim 5, wherein the computer readable storage medium is part of a computer system.

9. A method for using a computer system to numerically simulate an electrical circuit having a plurality of nodes and j circuit elements, the method which comprises:

a) reading a circuit description of the electrical circuit into the computer system;

b) reading in times $t_{start}$ and $t_{stop}$ of a time interval $[t_{start}; t_{stop}]$;

c) reading in at least one input value of a voltage and current for the electrical circuit for at least one specific time in the time interval $[t_{start}; t_{stop}]$;

d) calculating times $t_m$ and $t_{m+1}$ of a component interval $[t_m; t_m]$ in the time interval $[t_{start}; t_{stop}]$, where m=0;

e) calculating voltage values and/or current values at nodes of the electrical circuit in the component interval $[t_m; t_{m+1}]$ using models for circuit elements of the electrical circuit;

f) in accordance with an equation $t_i=t_i+h$, where $$h = \min_i h_i$$

and $h_j$ is a maximum permitted increment of the j-th one of the circuit elements, determining a time step $t_i$ or time steps $t_i$ in the component interval $[t_m; t_{m+1}]$ using the voltage values and/or the current values calculated in step e);

g) determining system equations of the circuit description for the time step $t_i$ or the time steps $t_i$ determined in step f) such that said circuit elements are described by physical formulas and such that dynamic effects of said circuit elements are described by differential equations;

h) in the time step $t_i$ or in the time steps $t_i$, calculating the voltage values and/or the current values at said nodes of said electrical circuit by solving the system equations determined in step g), the voltage values and/or the current values being calculated at the same nodes as in step e);

i) determining times $t_m$ and $t_{m+1}$ of a subsequent component interval $[t_m; t_{m+1}]$ in the time interval $[t_{start}; t_{stop}]$, where m=m+1;

j) repeating steps a) to i) in a loop-like fashion for a plurality of component intervals $[t_m; t_{m+1}]$ in the time interval $[t_{start}; t_{stop}]$ until $t_{m+1} \geq t_{stop}$; and k) outputting, on an output unit of the computer system, a profile of the voltage values and/or the current values that were calculated in step h) in the time interval $[t_{start}; t_{stop}]$.

10. The method according to claim 9, which further comprises providing the circuit description as a network list.

11. The method according to claim 9, which further comprises basing the models on tables or on neural networks.

12. The method according to claim 9, wherein in step d) $t_m=t_{start}$.

13. The method according to claim 9, which further comprises, between steps h) and i):

checking whether a difference between a voltage value and/or a current value calculated in step h) for the time step $t_i$ and a voltage value and/or a current value calculated in step e) for the time step $t_i$ exceeds a predefined value d, and if so, then setting m to a value (m−x) and repeating steps a) to i).

14. The method according to claim 9, which further comprises, in step h), when the system equations are linear, calculating the voltage values and/or the current values by numerically calculating the system equations.

15. The method according to claim 9, which further comprises, in step h), when the system equations are non-linear, calculating the voltage values and/or the current values by iteratively calculating the system equations.

16. The method according to claim 9, which further comprises, in step h), when the system equations are differential equations, calculating the voltage values and/or the current values by integrating the system equations over time.

17. The method according to claim 9, wherein the electrical circuit includes at least one circuit element embodied as a transistor.

18. The method according to claim 9, which further comprises calculating voltage values and/or current values at nodes of the electrical circuit using models for circuit elements of the electrical circuit in a component interval $[t_m; t_{m+1}]$.

19. A method for using a computer system to numerically simulate an electrical circuit having a plurality of nodes and j circuit elements, the method which comprises:

a) reading a circuit description of the electrical circuit into the computer system and selecting a part of the circuit description representing a part of the electrical circuit;

b) reading in times $t_{start}$ and $t_{stop}$ of a time interval $[t_{start}; t_{stop}]$;

c) reading in at least one input value of a voltage and current for the electrical circuit for at least one specific Lime in the time interval $[t_{start}; t_{stop}]$;

d) calculating times $t_m$ and $t_{m+1}$ of a component interval $[t_m; t_{m+1}]$ in the time interval $[t_{start}; t_{stop}]$, where m=0;

e) calculating voltage values and/or current values at nodes of the electrical circuit using models for circuit elements of the electrical circuit;

f) in accordance with an equation $t_i = t_{i-1} + h$, where $$h = \min_i h_i$$

and $h_j$ is a maximum permitted increment of the j-th one of the circuit elements, determining a time step $t_i$ or time steps $t_i$ in the component interval $[t_m; t_{m+1}]$ using the voltage values and/or the current values calculated in step e);

g) determining system equations of the part of the circuit description for the time step t or the time steps $t_i$ determined in step f) such that said circuit elements are described by physical formulas and such that dynamic effects of said circuit elements are described by differential equations;

h) in the time step $t_i$ or in the time steps $t_i$, calculating the voltage values and/or the current values at said nodes of the part of said electrical circuit by solving the system equations determined in step g), the voltage values and/or the current values being calculated at the same modes as in step e);

i) determining times $t_m$ and $t_{m+1}$ of a subsequent component interval $[t_m; t_{m+1}]$ in the time interval $[t_{start}; t_{stop}]$, where m=m+1;

j) repeating steps e) to i) in a loop-like fashion for a plurality of component intervals $[t_m; t_{m+1}]$ in the time interval $[t_{start}; t_{stop}]$ until $t_{m+1} \geq t_{stop}$; and k) outputting, on an output unit of the computer system, a profile of the voltage values and/or the current values that were calculated in step h) in the time interval $[t_{start}; t_{stop}]$.

20. The method according to claim 19, which further comprises providing the circuit description as a network list.

21. The method according to claim 19, which further comprises basing the models on tables or on neural networks.

22. The method according to claim 19, which further comprises, between steps h) and i):

checking whether a difference between a voltage value and/or a current value calculated in step h) for the time step $t_i$ and a voltage value and/or a current value calculated in step e) for the time step $t_i$ exceeds a predefined value d, and if so, then setting m to a value (m−x) and repeating steps e) to i).

23. The method according to claim 19, which further comprises, in step h), when the system equations are linear, calculating the voltage values and/or the current values by numerically calculating the system equations.

24. The method according to claim 19, which further comprises, in step h), when the system equations are non-linear, calculating the voltage values and/or the current values by iteratively calculating the system equations.

25. The method according to claim 19, which further comprises, in step h), when the system equations are differential equations, calculating the voltage values and/or the current values by integrating the system equations over time.

26. The method according to claim 19, wherein the part of the electrical circuit includes at least one circuit element embodied as a transistor.

27. A computer readable storage medium having computer executable instructions for performing a method with a computer system in order to numerically simulate an electrical circuit having a plurality of nodes and j circuit elements, the method which comprises:

a) reading a circuit description of the electrical circuit into the computer system;

b) reading in times $t_{start}$ and $t_{stop}$ of a time interval $[t_{start}; t_{stop}]$;

c) reading in at least one input of a voltage and current value for the electrical circuit for at least one specific time in the time interval $[t_{start}; t_{stop}]$;

d) calculating times $t_m$ and $t_{m+1}$ of a component interval $[t_m; t_{m+1}]$ in the time interval $[t_{start}; t_{stop}]$, where m=0;

e) calculating voltage values and/or current values at nodes of the electrical circuit using models for circuit elements of the electrical circuit;

f) in accordance with an equation $t_i = t_{i-2} h$, where $$h = \min_i h_i$$

and $h_j$ is a maximum permitted increment of the j-th one of the circuit elements, determining a time step $t_i$ or time steps $t_i$ in the component interval $[t_m; t_{m+1}]$ using the voltage values and/or the current values calculated in step e);

g) determining system equations of the circuit description for the time step $t_i$ or the time steps $t_i$ determined in step f) such that said circuit elements are described by physical formulas and such that dynamic effects of said circuit elements are described by differential equations;

h) in the time step $t_i$ or in the time steps $t_i$, calculating the voltage values and/or the current values at said nodes of said electrical circuit by solving the system equations determined in step g), the voltage values and/or the current values being calculated at the same nodes as in step e;

i) determining times $t_m$ and $t_{m+1}$ of a subsequent component interval $[t_m; t_{m+1}]$ in the time interval $[t_{start}; t_{stop}]$, where m=m+1;

j) repeating steps e) to i) in a loop-like fashion for a plurality of component intervals $[t_m; t_{m+1}]$ in the time interval $[t_{start}; t_{stop}]$ until $t_{m+1} \geq t_{stop}$; and k) outputting, on an output unit of the computer system, a profile of the voltage values and/or the current values that were calculated in step h) in the time interval. $[t_{start}; t_{stop}]$.

28. The computer readable storage medium according to claim 27, wherein the computer readable storage medium is a computer memory.

29. The computer readable storage medium according to claim 27, wherein the computer readable storage medium is a read-only memory.

30. The computer readable storage medium according to claim 27, wherein the computer readable medium is part of a computer system.

31. A computer readable storage medium having computer executable instructions for performing a method with a computer system in order to numerically simulate an electrical circuit having a plurality of nodes and j Circuit elements, the method which comprises:

a) reading a circuit description of the electrical circuit into the computer system and selecting a part of the circuit description representing a part of the electrical circuit;

b) reading in times $t_{start}$ and $t_{stop}$ of a time interval $[t_{start}; t_{stop}]$;

c) reading in at least one input value of a voltage and current for the electrical circuit for at least one specific time in the time interval $[t_{start}; t_{stop}]$;

d) calculating times $t_m$ and $t_{m+1}$ of a component interval $[t_m; t_{m+1}]$ in the time interval $[t_{start}; t_{stop}]$, where m=0;

e) calculating voltage values and/or current values at nodes of the electrical circuit using models for circuit elements of the electrical circuit;

f) in accordance with an equation $t_i = t_{i-1} + h$, where $$h = \min_i h_i$$

and $h_j$ is a maximum permitted increment of the j-th one of the circuit elements, determining a time step $t_i$ or time steps $t_i$ in the component interval $[t_m; t_{m+1}]$ using the voltage values and/or the current values calculated in step e)

g) determining system equations of the part of the circuit description for the time step $t_i$ or the time steps $t_i$ determined in step f) such that said circuit elements are described by physical formulas and such that dynamic effects of said circuit elements are described by differential equations;

h) in the time step $t_i$ or in the time steps $t_i$, calculating the voltage values and/or the current values at said nodes of the part of said electrical circuit by solving the system equations determined in step g), the voltage values and/or the current values being calculated at the same nodes as in step e);

i) determining times $t_m$ and $t_{m+1}$ of a subsequent component interval $(t_m; t_{m+1}]$ in the time interval $[t_{start}; t_{stop}]$ where m=m+1;

j) repeating steps e) to i) in a loop-like fashion for a plurality of component intervals $[t_m; t_{m+1}]$ in the time interval $[t_{start}; t_{stop}]$ until $t_{m+1} \geq t_{stop}$; and k) outputting, on an output unit of the computer system, a profile of the voltage values and/or the current values that were calculated in step h) in the time interval $[t_{start}; t_{stop}]$.

32. The computer readable storage medium according to claim 31, wherein the computer readable storage medium is a computer memory.

33. The computer readable storage medium according to claim 31, wherein the computer readable storage medium is a read-only memory.

34. The computer readable storage medium according to claim 31, wherein the computer readable storage medium is part of a computer system.

35. A method for using a computer system to numerically simulate an electrical circuit having a plurality of nodes and i circuit elements, the method which comprises:

a) reading a circuit description of the electrical circuit into the computer system;

b) reading in times $t_{start}$ and $t_{stop}$ of a time interval $[t_{start}; t_{stop}]$;

c) reading in at least one input value of a voltage and current for the electrical circuit for at least one specific time in the time interval $[t_{start}; t_{stop}]$;

d) calculating voltage values and/or current values at nodes of the electrical circuit at a plurality of times in the time interval $[t_{start}; t_{stop}]$ using models for circuit elements of the electrical circuit;

e) selecting a simulation time $t_n$ in the time interval $[t_{start}; t_{stop}]$;

f) determining system equations of the circuit description for the simulation time $t_n$ such that said circuit elements are described by physical formulas and such that dynamic effects of said circuit elements are described by differential equations;

g) calculating the voltage values and/or the current values at said nodes of said electrical circuit at the simulation time $t_n$ by solving the system equations that were determined in step f), the voltage values and/or the current values being calculated at the same modes as in step d);

h) using an equation $t_{n+1} = t_n + h$ for determining a next simulation time $t_{n+1}$ by analyzing the voltage values and/or the current values that were calculated in step d), where $$h = \min_i h_i$$

and $h_i$ is a maximum permitted increment of an i-th one of the circuit elements;

i) repeating steps f) to h) for a simulation time $t_n = t_{n+1}$ until $t_{n+1} \geq t_{stop}$;

j) outputting, on an output unit of the computer system, a profile of the voltage values and/or the current values that were calculated in step g) in the time interval $[t_{start}; t_{stop}]$; and in step g): calculating the voltage values and/or the current values by numerically calculating the system equations when the system equations are linear, calculating the voltage values and/or the current values by iteratively calculating the system equations when the system equations are nonlinear, or calculating the voltage values and/or the current values by integrating the system equations over time when the system equations are differential equations.

* * * * *